(12) United States Patent
Aoki

(10) Patent No.: US 6,423,148 B1
(45) Date of Patent: Jul. 23, 2002

(54) SUBSTRATE-CLEANING METHOD AND SUBSTRATE-CLEANING SOLUTION

(75) Inventor: Hidemitsu Aoki, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/388,485

(22) Filed: Sep. 2, 1999

(30) Foreign Application Priority Data

Sep. 7, 1998 (JP) ............................................ 10-252661

(51) Int. Cl.$^7$ .............................................. C23G 1/000
(52) U.S. Cl. ................ 134/3; 134/28; 134/29; 134/41; 134/902; 438/692; 438/906; 216/38; 216/88; 510/175; 510/176
(58) Field of Search ........................... 134/2, 3, 26, 28, 134/29, 41, 902; 438/692, 693, 906; 216/38, 88; 510/175, 176

(56) References Cited

U.S. PATENT DOCUMENTS

| | | | | |
|---|---|---|---|---|
| 4,129,457 A | * | 12/1978 | Basi ............................. | 134/2 |
| 4,156,619 A | | 5/1979 | Griesshammer | |
| 5,290,361 A | * | 3/1994 | Hayashida et al. ............ | 134/2 |
| 5,498,293 A | * | 3/1996 | Ilardi et al. ................... | 134/3 |
| 5,580,846 A | * | 12/1996 | Hayashida et al. .......... | 510/175 |
| 5,735,963 A | * | 4/1998 | Obeng ........................... | 134/3 |
| 5,855,811 A | * | 1/1999 | Grieger et al. ............. | 252/79.3 |
| 5,972,123 A | * | 10/1999 | Verhaverbeke ................. | 134/3 |
| 5,981,454 A | * | 11/1999 | Small ........................... | 510/175 |
| 6,015,506 A | * | 1/2000 | Streinz et al. ............. | 252/186.1 |
| 6,143,705 A | * | 11/2000 | Kakizawa et al. ........... | 510/175 |
| 6,143,706 A | * | 11/2000 | Morinaga .................... | 510/175 |
| 6,162,301 A | * | 12/2000 | Zhang et al. ................. | 134/3 |
| 6,165,956 A | * | 12/2000 | Zhang et al. ................ | 510/175 |

FOREIGN PATENT DOCUMENTS

| | | | |
|---|---|---|---|
| EP | 0 665 582 | 8/1995 | |
| EP | 0 690 483 | 1/1996 | |
| EP | 0 718 873 | 6/1996 | |
| EP | 0 742 282 | 11/1996 | |
| EP | 0 805 484 | 11/1997 | |
| EP | 0812011 A2 | * 12/1997 | ......... H01L/21/306 |
| JP | 5-259140 | 10/1993 | |
| TW | 85104724 | 4/1985 | |

* cited by examiner

*Primary Examiner*—Randy Gulakowski
*Assistant Examiner*—Jiri F Smetana
(74) *Attorney, Agent, or Firm*—Young & Thompson

(57) ABSTRACT

In cleaning a substrate which has a metal material and a semiconductor material both exposed at the surface and which has been subjected to a chemical mechanical polishing treatment, the substrate is first cleaned with a first cleaning solution containing ammonia water, etc. and then with a second cleaning solution containing (a) a first complexing agent capable of easily forming a complex with the oxide of said metal material, etc. and (b) an anionic or cationic surfactant.

15 Claims, 9 Drawing Sheets

First Step    Second Step (a)

(b)

(c)

(a)

(b)

(c)

(a)

(b)

Enlarged view of dished part

SUBSTRATE-CLEANING METHOD AND SUBSTRATE-CLEANING SOLUTION

BACKGROUND OF THE INVENTION

1. Field of the Invention

The present invention relates to a substrate-cleaning method used for cleaning of a substrate which has a metal material and a semiconductor material both exposed at the surface, as well as to a substrate-cleaning solution used in the substrate-cleaning method.

2. Description of the Related Art

In the process for formation of damascene interconnection and leveling of via hole, chemical mechanical polishing (CMP) has been in wide use in recent years.

CMP is a technique used for leveling of film, wherein a wafer having an inter-layer insulating film and a metal material film formed thereon is pressed against a buff (a cloth) and rotated while feeding a slurry (a mixture of abrasive particles and a chemical reagent) and thereby the inter-layer insulating film and the metal material film are polished and leveled by the combination of a chemical action and a mechanical action.

When a metal interconnection or the like is formed on a substrate by CMP, a large amount of impurities remain on the silicon oxide film and the metal region after the CMP, and this becomes a problem. For example, in CMP of tungsten (W), there is used, for good polishing rate and processing accuracy, a solution which is a mixture of (1) a mixed solution of aqueous hydrogen peroxide and an oxidizing agent (Fe) and (2) an abrasive (silica particles or alumina particles); after the blanket W has been removed by CMP, a large amount of particles (silica particles, alumina particles, etc.) and metal impurities (Fe contaminant, etc.) remain on the exposed surface of silicon oxide film. Ordinarily, the number of remaining silica particles or alumina particles is 30000 per wafer or more and the atoms of remaining Fe is $10^{12}$ per $cm^2$ or more.

Remaining of impurities on wafer gives rise to cross-contamination in the subsequent steps (e.g. the step for formation of inter-layer insulating film, the step for formation of interconnection, etc.), and this becomes a problem. For example, the inside of a CVD apparatus (where an inter-layer insulating film is formed) is contaminated, or disconnection of aluminum interconnection is invited. Therefore, it is strongly desired to develop a method for efficiently removing, by cleaning, the impurities remaining on a wafer after CMP.

Thus, when a substrate is subjected to CMP, it is necessary to efficiently remove, by cleaning, the impurities adhering to the substrate after the CMP. This necessity exists in cleaning of all substrates having a metal interconnection, a via hole, etc. formed thereon. For such substrate cleaning, so-called RCA cleaning is in wide use. The RCA cleaning comprises (1) a step of removing particles by cleaning with ammonia-aqueous hydrogen peroxide and (2) a step of removing metal impurities by the use of hydrochloric acid-aqueous hydrogen peroxide, DHF (diluted hydrofluoric acid)), citric acid or the like. Thus, in the RCA cleaning, the cleaning is conducted in two steps and thereby the particles and metal impurities remaining on a substrate can be efficiently removed without impairing the substrate.

Further, there is disclosed, in JP-A-10-72594, a method for cleaning of a substrate having a metal interconnection or the like formed thereon, by using a cleaning solution containing (a) an organic acid such as citric acid, oxalic acid or the like and (b) a complexing agent such as aminopolycarboxylic acid or the like. In the method, particles and metal impurities are said to be removed without causing the corrosion of metal interconnection or impairing the surface flatness of semiconductor substrate.

Meanwhile, in JP-A-8-187475 is disclosed a method for cleaning of a silicon substrate by using a cleaning solution containing a surfactant (this method is different from the method for cleaning of a substrate having a metal interconnection formed thereon).

The above-mentioned conventional cleaning techniques, however, have had the following problems.

In the conventional RCA cleaning, metal impurities are removed by the second cleaning (acid cleaning). When the acid used in the acid cleaning is hydrochloric acid-aqueous hydrogen peroxide or DHF (diluted hydrofluoric acid), the acid has too strong a dissolving power for metals and corrodes the metal interconnection or the like exposed at the substrate surface. Meanwhile, when the acid used in the acid cleaning is citric acid, the acid hardly causes the above problem, but is insufficient in cleaning power and, in some cases, has been unable to completely remove the metal impurities present on the substrate. In the case of citric acid, there has also been a problem in that a large amount of citric acid must be used for securing a sufficient cleaning power, making high the TOC (total organic carbon) of the used cleaning solution.

In the conventional RCA cleaning, there has further been a problem in that the first cleaning (alkali cleaning) invites the adhesion of metal impurities to substrate surface, making difficult the removal of the adhered metal impurities. This problem is explained below on the case of a silicon substrate having a copper interconnection formed thereon. When the first cleaning (alkali cleaning) has been conducted by brush-cleaning with ammonia water (concentration: 0.1 to 2% by weight), the Cu interconnection exposed on the substrate surface is etched and pits may be formed in the Cu interconnection film. This happens because the ammonia water forms an ammonia complex with Cu and thereby the dissolution of Cu takes place. Since the Cu interconnection film is in the form of polycrystal, the etching rate is larger in the grain boundaries and pits are formed. When metal impurities adhere onto the pits, the metal impurities are very difficult to remove by the second step (acid cleaning). In filling W or Cu in the groove or plug of substrate, pores may be formed inside the W or Cu filled in the groove or plug. Once impurities such as particles and metals enter the pores during CMP, they are difficult to remove by cleaning.

When a metal wiring or the like is formed by CMP, the removal of the metal impurities adhering to the metal region of substrate after CMP is difficult also for other reasons. This matter is explained below.

When a metal interconnection or the like is formed by CMP, so-called dishing takes place ordinarily. The dishing is a phenomenon that a dent is generated at the center of the surface of a filled conductive film. FIG. 9 is drawings showing a state in which a dished part 23 has been generated in the formation of a Cu interconnection 1 by CMP. An inter-layer insulating film 3 is formed on a silicon substrate 4; in a given portion of the inter-layer insulating film 3 is filled a Cu interconnection 1 via a barrier film 2 (a TiN layer). In the step of formation of this Cu interconnection 1, the unnecessary parts of the Cu interconnection 1 and the barrier film 2 (a TiN layer) are removed by CMP; at that time, the center of the surface of the Cu interconnection 1 is polished and dented and, as a result, a dished part 23 is generated. The dished part 23 appears because the polishing rate of Cu is far greater than that of TiN. In other words, when TiN on the inter-layer insulating film 3 is removed, the polishing of Cu layer (this layer has a larger polishing rate than TiN) proceeds excessively and thereby dishing takes place. In order to completely remove the unnecessary part of TiN, slight overetching is necessary and, therefore, dishing appears more or less in many cases. Dishing is striking when the length of conductive layer (i.e. the length of interconnection) is large.

Generation of dished part invites adhesion of impurities thereto and the removal of the adhered impurities becomes difficult.

Generation of dished part may incur formation of a different level part at the boundary between the barrier and the filled conductive film (see the enlarged view of FIG. 9). Impurities (e.g. particles and metals) adhere easily to this different level part and the adhered impurities are difficult to remove by later cleaning.

Thus, when CMP is applied to a substrate having a metal interconnection layer or a via hole, a dished part is generated, making very difficult the removal of particles and metal impurities. That is, the impurities adhering to the dished part of metal film or the different level part between barrier film and metal film are not removed by conventional acid cleaning; even when physical cleaning (e.g. brush cleaning using a rapidly rotating brush) is used in combination with the acid cleaning, the shear force of the brush does not reach the dished part and no sufficient removal is attained.

Meanwhile, in the cleaning method described in JP-A-10-72594, a complexing agent such as aminopolycarboxylic acid or the like is used to achieve improved removal of metal impurities. In this cleaning method, however, no sufficient cleaning is obtained for the ever increasing requirements for substrate cleaning, and removal of, in particular, the metal impurities adhering to the dished part after CMP is very difficult.

As described above, when a substrate having a metal interconnection or the like is subjected to CMP and then cleaned, there is a problem which does not exist in cleaning of a substrate having no metal interconnection or the like, because the former substrate has an exposed metal region and a dished part is generated in the metal region.

Further, when a substrate having a metal interconnection or the like is subjected to CMP and then cleaned by, for example, the above-mentioned RCA cleaning, ordinarily particles are removed by the first step (alkali cleaning) and metal impurities are removed by the second step (acid cleaning); in this case, there is another problem which does not exist in cleaning of a substrate having no metal interconnection or the like, because pits are generated in the metal region of the former substrate.

The conventional RCA cleaning and the cleaning described in JP-A-10-72594 provide no sufficient solution to the above-mentioned problems. The cleaning method described in JP-A-8-187475, which is for cleaning of a substrate having no exposed metal region, provides no solution for the above problems which exist in cleaning of a substrate having an exposed metal region.

The present invention aims at providing a substrate-cleaning method which efficiently removes the particles and metal impurities present on a substrate having a metal material and a semiconductor material both exposed at the surface, particularly the metal impurities adhering to the surface of the metal region of the substrate and which can achieve higher cleanliness of substrate than before.

SUMMARY OF THE INVENTION

According to the present invention there is provided a substrate-cleaning method used for cleaning of a substrate which has a metal material and a semiconductor material both exposed at the surface and which has been subjected to a chemical mechanical polishing treatment with a polishing solution, said method comprising the steps of:

(A) a first step of cleaning said substrate with a first cleaning solution containing ammonia water or an aqueous catholyte generated in electrolysis, and (B) a second step of cleaning the substrate after the first step (A) with a second cleaning solution containing (a) a first complexing agent capable of easily forming a complex with the oxide of said metal material or the oxide of the metal contained in said polishing solution, and (b) an anionic or cationic first surfactant.

According to the present invention there is further provided a substrate-cleaning solution used for cleaning of a substrate which has a metal material and a semiconductor material both exposed on the surface, which cleaning solution contains (a) a first complexing agent capable of easily forming a complex with the oxide of said metal material and (b) an anionic or cationic surfactant.

According to the present invention there is furthermore provided a substrate-cleaning solution used for cleaning of a substrate which has a metal material and a semiconductor material exposed on the surface and which has been subjected to a chemical mechanical polishing treatment with a polishing solution, which cleaning solution contains (a) a first complexing agent capable of easily forming a complex with the oxide of said metal material, (b) an anionic or cationic surfactant, and (c) a second complexing agent capable of easily forming a complex with the metal impurities remaining on the surface of the substrate subjected to the chemical mechanical polishing treatment.

The second cleaning solution used in the substrate-cleaning method of the present invention and the substrate-cleaning solution of the present invention contain an anionic or cationic surfactant. This surfactant functions so as to (1) make hydrophilic the surface of the substrate to be cleaned and make easy the detachment of the metal impurities present on the surface, from the surface and (2) prevent the readhesion of the detached metal impurities to the substrate surface. The second cleaning solution used in the substrate-cleaning method of the present invention and the substrate-cleaning solution of the present invention further contain a first complexing agent capable of easily forming a complex with the metal material exposed at the substrate surface. This complexing agent functions so as to make easy the detachment of the metal impurities present on the substrate surface, from the surface and acts effectively particularly on the metal impurities adhering to the metal region of the substrate. The complexing agent adheres easily particularly to metals. The complexing agent can efficiently remove, in particular, the metal impurities adhering to the pit generated in the metal region as a result of the alkali treatment [the first step (A)] and the metal impurities adhering to the dished part of the metal region formed by CMP. Further, the complexing agent can make easy the removal of the metal impurities present in the pore which may be formed inside the metal region filled in the groove or hole of substrate and can effectively prevent the readhesion of the impurities. The surfactant used in the present invention makes adequately hydrophilic the surfaces of the pit, the dished part and the pore, and its synergism with the complexing agent promotes the detachment of metal impurities. Further, the surfactant covers the surfaces of the metal impurities detached and thereby can prevent the readhesion of the impurities to the metal region.

The surfactant can exhibit a high cleaning effect when used in combination with the complexing agent. When the surfactant is used singly, no sufficient cleaning effect is obtainable and the removal of the metal impurities adhering to the substrate metal region is difficult.

As described above in 2. Description of the Related Art, the technique of using a surfactant in cleaning a silicon substrate is already known. In contrast, the present invention has a feature in that a combination of a surfactant and a complexing agent is used in cleaning of a substrate having a metal material exposed at the surface. This combined use of a surfactant and a complexing agent can exhibit an excellent effect for removal of the metal impurities adhering to the metal region of substrate, which effect has been unobtainable with the single use of a surfactant or a complexing agent. The combination of a surfactant and a complexing agent exhibits a noticeable effect for removal of, in particular, the metal impurities adhering to the pit generated by the first cleaning using an alkali and the metal impurities adhering to the dished part generated in CMP.

DETAILED DESCRIPTION OF THE PREFERRED EMBODIMENTS

Figure 1:
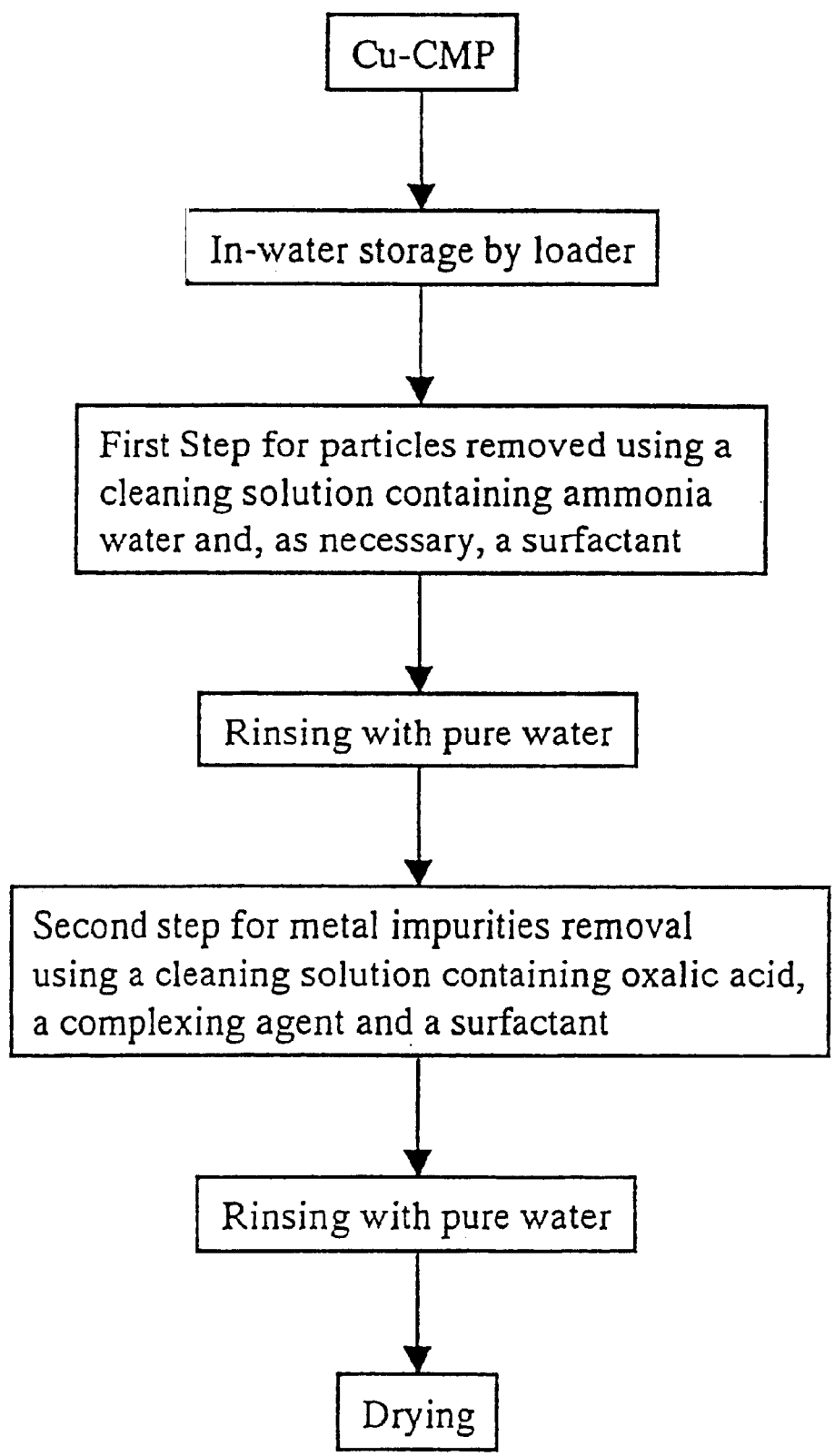
FIG. 1 is a drawing showing the flow sequence of an example of the substrate-cleaning method of the present invention.

In the present invention, an anionic or cationic surfactant is used. As the anionic surfactant, there are used surfactants of carboxylic acid type, sulfonic acid type, sulfuric ester type or the like. That is, there are used acids having —COOH group, —SO$_3$H group or —OSO$_3$H group, and salts thereof. The salts are preferably ammonium salts and primary, secondary or tertiary amine salts, all of which have small adverse effects on the quality of the semiconductor device to be cleaned.

As specific examples of the anionic surfactant, there are mentioned $C_{12}H_{25}O(CH_2CH_2O)_2SO_3H$, $C_9H_{19}PhO$ $(CH_2CH_2O)_4SO_3H$ (Ph refers to phenylene group), $C_{12}H_{25}O(CH_2CH_2O)_4SO_3H$, and ammonium salts or primary, secondary or tertiary amine salts thereof. Of these surfactants, particularly preferred are ammonium salts or primary, secondary or tertiary amine salts of sulfuric esters, all of which have high removability for the metal impurities adhering to the metal region of substrate.

As the cationic surfactant, there are mentioned, for example, $C_8H_{17}N(CH_3)_3Br$ and $C_{12}H_{25}N(C_2H_5)(CH_3)_2Br$.

In the present invention, the amount of the anionic or cationic surfactant used is appropriately determined depending upon the kind of the surfactant used; however, the amount is preferably 1 to 1000 ppm, more preferably 10 to 500 ppm relative to the weight of the substrate-cleaning solution used. When the amount is too small, no sufficient cleaning effect is obtained in some cases. When the amount is too large, disposal of the used cleaning solution is difficult in some cases.

The first cleaning solution used in the first step of the substrate-cleaning method of the present invention, preferably contains an anionic or cationic surfactant. Thereby, the particles removal in the first step becomes more effective. Further, use of such a surfactant in the first step can make adequately hydrophilic the surface of the substrate to be subjected to the second step and can make more effective the metal impurities removal conducted in the second step. As the surfactant used in the first step can be the same as mentioned above. In the Examples described later, there are shown cases wherein the same surfactant is used in the first cleaning step and the second cleaning step. However, the surfactants used in these two cleaning steps need not be restricted to the same kind, and it is desired to select the surfactant used in each step, so as to have good matching with the cleaning solution used. For example, when the cleaning solution is an ammonia type, it is preferable to select a surfactant having good matching with the ammonia type; when the cleaning solution contains oxalic acid, it is preferable to select a surfactant having good matching with oxalic acid. Thereby, metal impurities can be removed at a higher efficiency.

In the present invention, a carboxylic acid or a salt thereof can preferably be used as the first complexing agent. The carboxylic acid or the salt thereof is preferably at least one compound selected from oxalic acid, citric acid, malic acid, maleic acid, succinic acid, tartaric acid, malonic acid and slats thereof.

In the present invention, "metal material" refers to, for example, a metal material filled in the interconnection groove or via hole of substrate. The metal material is, for example, tungsten, copper or aluminum.

In the present invention, the "substrate" to be cleaned refers to a substrate having a metal material and a semiconductor material both exposed at the surface. For example, it is a substrate which is made of silicon or other semiconductor material and which has an insulating film (e.g. a silicon oxide film), a metal film, etc. all formed thereon. It is preferably a substrate having thereon an inter-layer insulating film in which a metal material-filled groove or hole is formed. When such a substrate is used, removal of metal impurities is difficult owing to the formation of pits mentioned above, etc.; therefore, the effect of the present invention is exhibited strikingly. Also, when the substrate to be cleaned is a substrate wherein a barrier film is formed on the inner wall of the groove or hole and a metal material-made film is formed on the barrier film, removal of metal impurities is difficult owing to the formation of dished part during CMP; therefore, the effect of the present invention is exhibited strikingly.

Preferably a substrate-cleaning solution of the present invention used for cleaning of a substrate does not contain a component which gives some damage to metal material exposed at the surface of a substrate. Examples of the components are hydrogen peroxide, hydrofluoric acid. The substrate-cleaning solution of the present invention can consist of the following component (a), (b) and water or consist of the following component (a), (b), (C) and water.
(a) a first complexing agent capable of easily forming a complex with the oxide of said metal material
(b) an anionic or cationic surfactant
(c) a second complexing agent capable of easily forming a complex with the metal impurities remaining on the surface of the substrate subjected to the chemical mechanical polishing treatment.

Hereinafter, preferred embodiments of the present invention are described. In the following description, "ppm" refers to ppm relative to the weight of the cleaning solution used, unless otherwise specified.

(First Embodiment)

Figure 3:
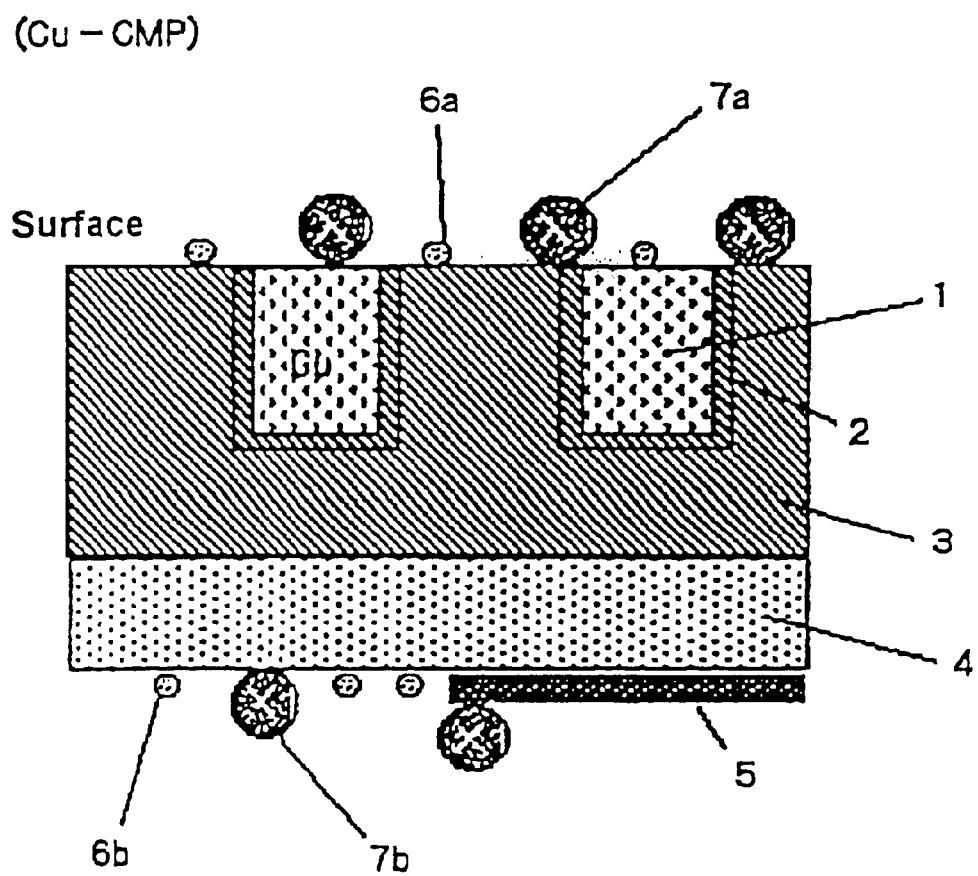
FIG. 3 is a drawing explaining the surface condition of a wafer to be cleaned by the substrate-cleaning method of the present invention.

In FIG. 3 is shown the surface condition of a wafer to be cleaned in the present embodiment. This wafer has an inter-layer insulating film 3 (made of $SiO_2$) in which grooves for interconnection are formed. In the grooves, a Cu interconnection 1 is formed via a barrier film 2. FIG. 3 shows a state after formation of a Cu film by plating or CVD, subsequent CMP, and particles removal.

As the inter-layer insulating film 3, there can be used, besides a conventional silicon oxide film, a low dielectric constant film capable of reducing the electrostatic capacity C of the inter-layer insulating film 3, to achieve a higher speed of device. Such a low dielectric constant film has a relative dielectric constant of k=1.8 to 3.5 at most as compared with k=3.9 to 4.2 possessed by conventional silicon oxide film. Usable examples of the low dielectric constant film are organic film such as benzocyclobutene (BCB) film, Parylene-N film, CYTOP film and the like; inorganic films such as Xerogel film, HSQ (hydrogen silisesquioxane) film and the like; and organic-inorganic compound films such as HMO (hydrogen peroxide/ methylsilane-based CVD) film and the like. Of these, preferred is a HSQ film (k=2.8 to 3.2) for its stable performance.

The barrier 2 is preferably made of Ta, TiN or the like and is formed by means of PVD, CVD or the like. After the film 2 has been formed, a Cu film is formed thereon by means of CVD, PVD, plating or the like. Then, in order to remove the unnecessary portions of the Cu film and the barrier film 2, chemical mechanical polishing (i.e. CMP) is conducted using an abrasive containing abrasive particles 7a and an antioxidant, until the inter-layer insulating film 3 is exposed; thereby, the Cu layers are insulated from each other by the inter-layer insulating film and a Cu interconnection 1 is formed.

In CMP conducted for a substrate having an exposed Cu region (this CMP is hereinafter abbreviated to "Cu-CMP"), there is used in many cases, as the abrasive, a solution which is a mixture of (1) a solution containing an antioxidant (e.g. aqueous hydrogen peroxide or iron nitrate) and (2) alumina particles. When such a solution is used, there remain, on the whole surface of the wafer after CMP, alumina particles 7a and 7b (30000 particles or more per wafer). The Cu removed by CMP is oxidized by aqueous hydrogen peroxide and becomes $CuO_x$ (referred to Cu particles), and Cu particles 6a (of $10^{12}$ atoms/cm$^2$ or more) remain on the upper surface of the wafer. When the cleaning solution contains K or Fe, there also appears a K or Fe contaminant. To the lower surface of the wafer adheres a Cu film at the time of Cu film formation, and Cu particles 6b ($10^{14}$ atoms/cm$^2$ or more) or a Cu film 5 remains. These particles and metal impurities must be cleaned without damaging the Cu interconnection.

The alumina particles derived from the abrasive, remaining on the wafer can be removed even by brush cleaning. Meanwhile, other contaminants such as Cu and the like must be removed chemically without impairing the Cu interconnection region. Therefore, these two kinds of removals are desired to be made in different steps. Hence, in the present embodiment, there are conducted (1) a first step of removing particles (e.g. alumina particles) by cleaning using ammonia water, and (2) a second step of removing metal impurities using a cleaning solution containing a carboxylic acid and an anionic surfactant. Thereby, metal impurities, etc. are removed effectively without impairing the Cu interconnection region of wafer.

To begin with, description is made on the first step of removing remaining particles such as alumina particles and the like. In the first step, it is preferred that in order to suppress the readhesion of detached particles to the wafer, the wafer surface and the particle surfaces are allowed to have the same polarity and electrically repel each other. From this standpoint, there is used, in the first step, a first cleaning solution containing ammonia water or the like. By using such a cleaning solution, the wafer surface and the particle surfaces can have the same polarity and repel each other electrically, and the readhesion of detached particles to the wafer can be suppressed. Addition of an anionic or cationic surfactant to the first cleaning solution can make larger the electrical repellence between the wafer surface and the particle surfaces and can suppress the readhesion of detached particles to the wafer more effectively. The amount of the surfactant added to the cleaning solution is preferably 1 to 1000 ppm.

Preferably, ammonia water is used as the first cleaning solution, because ammonia water hardly gives rise to the surface contamination of semiconductor material. Since Cu easily forms a complex with ammonia water of high concentration and dissolves therein, the concentration of ammonia water used is preferably 0.0001 to 0.5% by weight, more preferably 0.0005 to 0.01% by weight. When the concentration of ammonia water is too low, no sufficient cleaning effect is obtained. When the concentration is too high, the surface of Cu gets rough, causing the deterioration of the performance of semiconductor device. When the metal material is W, the concentration of ammonia water may be 0.0001 to 5% by weight.

As the first cleaning solution, an aqueous catholyte generated in electrolysis may be used in place of ammonia water. The aqueous catholyte generated in electrolysis refers to a solution generated at the cathode side of electrolysis when pure water or water containing a small amount (0.5% by weight or less) of ammonium ion is subjected to electrolysis. In obtaining an aqueous catholyte, a two-cell type electrolyzer is used generally (see, for example, Denki Kagaku Binran, 4th edition, p. 277, 1985). When pure water is electrolyzed, a modified electrolyzer thereof is used. The feed water for aqueous catholyte, i.e. pure water or water containing a small amount (0.5% by weight or less) of ammonium ion is fed to each electrolytic cell and a DC voltage is applied for electrolysis of the fed water. The aqueous catholyte generated at the cathode side is neutral to weakly alkaline but has a high reducing power owing to the active hydrogen generated at the cathode; therefore, the aqueous catholyte, similarly to ammonia water of high concentration, can make negative both the wafer surface and the particle surfaces and can suppress the readhesion of particles to wafer without causing the etching of Cu film.

Also as the first cleaning solution, a solution containing dissolved hydrogen may be used in place of the above-mentioned ammonia water or aqueous catholyte generated in electrolysis. The solution containing dissolved hydrogen refers to an aqueous solution obtained by dissolving hydrogen in pure water or water containing a small amount (0.5% by weight or less) of ammonium ion. This dissolution of hydrogen is conducted by bubbling or the like.

When the first cleaning solution is an aqueous catholyte generated in electrolysis or a solution containing dissolved hydrogen, the redox potential thereof is set preferably at −1000 to −300 mV, more preferably at −800 to −600 mV when silver chloride is used as a reference electrode. The ammonia concentration in aqueous catholyte or solution containing dissolved hydrogen is preferably 0.0005 to 0.01% and the amount of hydrogen dissolved therein is preferably 0.1 to 10 ppm.

When the inter-layer insulating film 3 is a low dielectric constant film (e.g. a SOG film), etching or performance reduction may take place owing to the ammonia water used as the first cleaning solution. In this case, therefore, the first cleaning solution used is preferably an aqueous catholyte obtained by electrolysis of pure water, or a solution containing dissolved hydrogen.

Next, description is made on the second step cleaning of the present embodiment. In the second step is used a second cleaning solution containing (a) a first complexing agent capable of easily forming a chelate complex with the oxide of the metal material on substrate, (b) an anionic or cationic surfactant, and (c) a second complexing agent capable of easily forming a complex with the metal impurities remaining on the substrate after CMP. The cleaning in the second step is conducted preferably by spin cleaning, but a mechanical cleaning using a brush may be used.

As the first complexing agent, a carboxylic acid, for example, oxalic acid can be used. Oxalic acid is capable of effectively forming a chelate complex with the Cu particles ($CuO_x$) generated in Cu-CMP. Meanwhile, the Cu film on wafer has a metallic bond and hardly forms a complex with oxalic acid; therefore, the Cu film is not etched. TiN, Ta, TaN or TaSiN (which constitutes the barrier film) forms no complex with oxalic acid and, therefore, is not etched. Thus, neither the Cu interconnection nor the barrier is etched (deteriorated) and the Cu particles remaining on the wafer can be selectively removed.

The Cu particles adhering onto the copper interconnection, however, are not sufficiently removed only by the etching action of oxalic acid. Hence, in the present embodiment, an anionic or cationic surfactant is used. By using this surfactant, it is possible to make adequately hydrophilic the surface of the copper interconnection and promote the detachment of the Cu particles adhering thereto. When, as in the present embodiment, Ta or TiN is used for the barrier film 2 and Cu is used for the filled conductive film, dishing often appears (as a result, a dished part is generated) in the Cu interconnection 1 owing to the difference in chemical mechanical polishing rate between Ta or TiN and Cu. The Cu particles adhering to this dished part are generally difficult to remove. In the present embodiment, however, these Cu particles, etc. can be removed easily because of the above-mentioned use of a surfactant in the second cleaning solution. Metal impurities (e.g. K, Ca, Ti, Cu and Zn) may remain on the wafer after CMP, depending upon the kind of the policing solution (slurry) used in CMP and the kind(s) of the film(s), etc. formed on the wafer before CMP. These metals do not always form chelate complexes with the first complexing agent. Hence, in the present embodiment, there is used, in addition to the first complexing agent, a second complexing agent capable of easily forming a complex with the metal impurities remaining on the wafer after CMP. As the second complexing agent, a polyaminocarboxylic acid or ammonium fluoride is used preferably. Preferable examples of the polyaminocarboxylic acid are compounds such as ethylenediaminetetraacetic acid (EDTA), trans-1,2-cyclohexanediaminetetraacetic acid (CyDTA), nitrilotriacetic acid (NTA), diethylenetriaminepentaacetic acid (DTPA), N-(2-hydroxyethyl)ethylenediamine-N,N',N'-triacetic acid (EDTA-OH) and the like; and salts thereof. Use of a salt which has no adverse effect on the properties of the semiconductor device produced, is preferred, and use of a metal-free salt (e.g. an ammonium salt) is particularly preferred. The concentration of the second complexing agent is preferably 1 to 10000 ppm, more preferably 10 to 1000 ppm relative to the substrate-cleaning solution. When the concentration is too low, no sufficient complexing effect is obtained. When the concentration is too high, an organic substance remains on the substrate, inviting the performance deterioration of semiconductor device, or a higher cost is required for the disposal of the used cleaning solution.

By using the second complexing gent, the metal impurities remaining on the wafer after CMP can be removed and, by the synergistic effect of the second completing agent and the above-mentioned surfactant, the readhesion of the removed metal impurities to the wafer can be prevented.

The cleaning process shown in the present embodiment enables effective removal of abrasive particles and metal contaminants (e.g. Cu) without damaging the Cu interconnection and the barrier film (made of TiN, Ta, TaN, TaSiN or the like) formed on the wafer.

(Second Embodiment)

Figure 4:
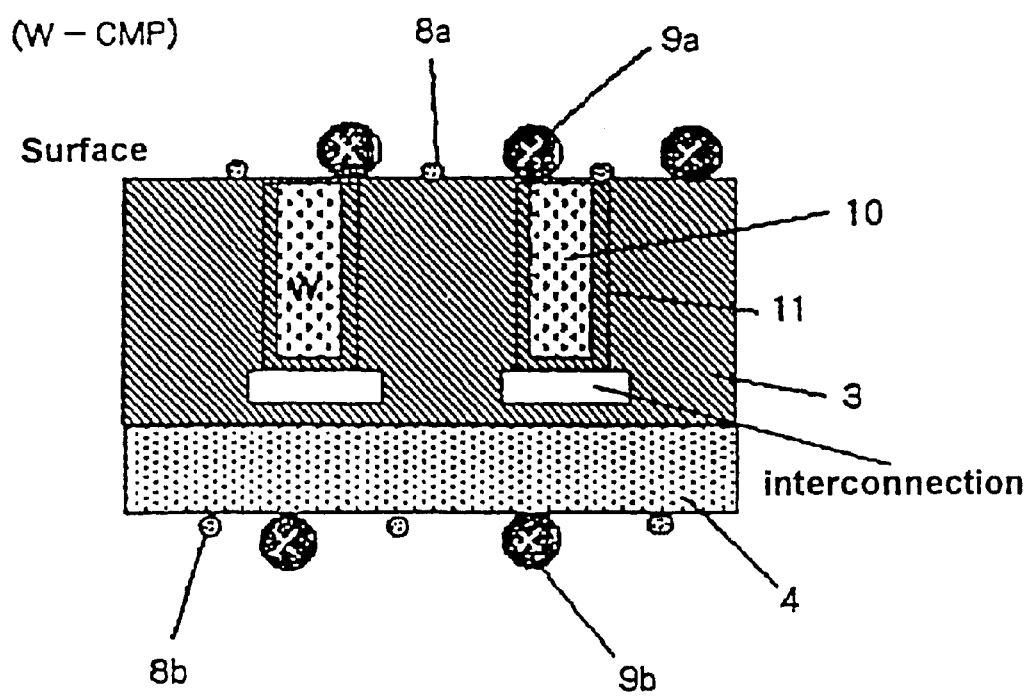
FIG. 4 is a drawing explaining the surface condition of a wafer to be cleaned by the substrate-cleaning method of the present invention.

In FIG. 4 is shown the surface condition of a wafer to be cleaned in the present embodiment. This wafer has an inter-layer insulating film 3 formed on a Si substrate 4. As the inter-layer insulating film 3, there can be used a $SiO_2$ film or a SOG film (e.g. a HSQ film). In the inter-layer insulating film 3 is formed a interconnection film 12 made of Al or Cu, and a barrier film 11 and a W plug 10 are formed so as to contact with the interconnection film 12. FIG. 4 shows a state after formation of a W film by CVD, sputtering or the like, subsequent CMP, and particles removal.

In W-CMP, there is often used, was the abrasive, a solution which is a mixture of (1) a mixed solution of aqueous hydrogen peroxide and an antioxidant containing iron nitrate and (2) silica particles; on the whole surface of the wafer after CMP remain 30000 or more (per wafer) abrasive particles (silica particles) 9a and 9b. On the upper surface of the wafer appear Fe contaminants 8a of $10^{12}$ atoms/cm$^2$ or more. Depending upon the kind of the polishing solution used, there also appear contaminants 8b of K, Cu, Ca, Ti, Zn, etc. These contaminants (particles and metal impurities) must be cleaned without damaging the W plug.

Next, the cleaning process of the present embodiment is described. The process is basically the same as the cleaning process after Cu-CMP.

In the first step, in order to remove the particles remaining on the substrate after W-CMP, brush cleaning is conducted for the substrate using a first cleaning solution, i.e. ammonia water (0.0001 to 5% by weight), an aqueous catholyte generated in electrolysis, or a solution containing dissolved hydrogen (ammonia concentration in aqueous catholyte or solution: 0 to 5% by weight). Addition of an anionic or cationic surfactant to the cleaning solution can make large the mutual electrical repellence between the wafer surface and the particles surface and can suppress the readhesion of removed particles to wafer more effectively. The amount of the surfactant added is preferably 1 to 1000 ppm.

In the second step is used a cleaning solution containing (a) a first complexing agent capable of easily forming a complex with the oxide of the metal contained in the polishing solution used in W-CMP and (b) an anionic or cationic surfactant. The cleaning is conducted preferably by spin cleaning, but mechanical cleaning using a brush may be conducted.

As the first complexing agent, a carboxylic acid, for example, an aqueous oxalic acid solution (0.01 to 5% by weight) can be used. The first complexing agent may also be a chemical solution containing at least one kind selected from oxalic acid, ammonium oxalate and polyaminocarboxylic acids.

In W-CMP, there is often used a polishing solution containing iron nitrate. Therefore, the Fe contaminant of $10^{12}$ atms/cm$^2$ or more derived from the iron nitrate must be removed effectively. The Fe contaminant remaining on the silicon oxide film are in the form of $FeO_x$. The oxalic acid contained in the first complexing agent can form a complex with $FeO_x$ owing to the chelating effect, whereby the $FeO_x$ on the silicon oxide film can be removed to some extent.

However, the abrasive particles and Fe contaminant adhering onto the W plug are not sufficiently removed, in some cases, only by the carboxylic acid contained in the first complexing agent. Hence, in the second step, an anionic or cationic surfactant is used together with the carboxylic acid. By using this surfactant, the surface of the W plug can be made adequately hydrophilic and the detachment of the metal impurities adhering on the W plug can be promoted. When there are formed, in the substrate, a barrier film 2 made of Ta or TiN and a filled conductive film made of W, a dished part is often generated on the W plug 10 owing to the difference in CMP rate between Ta or TiN and W. The metal impurities adhering to this dished part are generally difficult to remove. In the present embodiment, however, these metal impurities can be removed easily. Metal impurities such as K, Ca, Ti, Cu, Zn, etc. may remain on the wafer after W-CMP, depending upon the kind of the polishing solution (slurry) used in W-CMP and the kind(s) of the film(s), etc. formed on the wafer after CMP. These metals do not always form chelate complexes with the first complexing agent. Hence, as in the first embodiment, a second complexing agent may be used in the second cleaning solution, in addition to the first complexing agent. The kind and concentration of the second complexing agent are the same as those in the first embodiment.

By using the cleaning process of the present embodiment, abrasive particles and metal contaminants (e.g. Fe) can be effectively removed without damaging the W plug and barrier film (made of TiN or Ta) formed on wafer.

(Third Embodiment)

The present embodiment is a case of cleaning a wafer having a Cu interconnection, subjected to Cu-CMP. The flow sequence of the present embodiment is explained with reference to FIG. 1.

A wafer after Cu-CMP is stored in water by the loader of a cleaning apparatus in order to prevent the drying of the wafer. Drying of wafer makes difficult the removal of abrasive particles remaining thereon. The water in loader is preferably a fresh pure water which is fed continuously. This is necessary because the antioxidant adhering to the wafer may dissolve in water and corrode the Cu interconnection of wafer. Holding of wafer in water may be replaced by continuous wetting of wafer by showering.

Since Cu is corroded easily as compared with W, etc., it is preferred that the wafer after Cu-CMP is cleaned quickly and that the CMP apparatus and the cleaning apparatus are connected so as to enable the quick cleaning.

Figure 2:
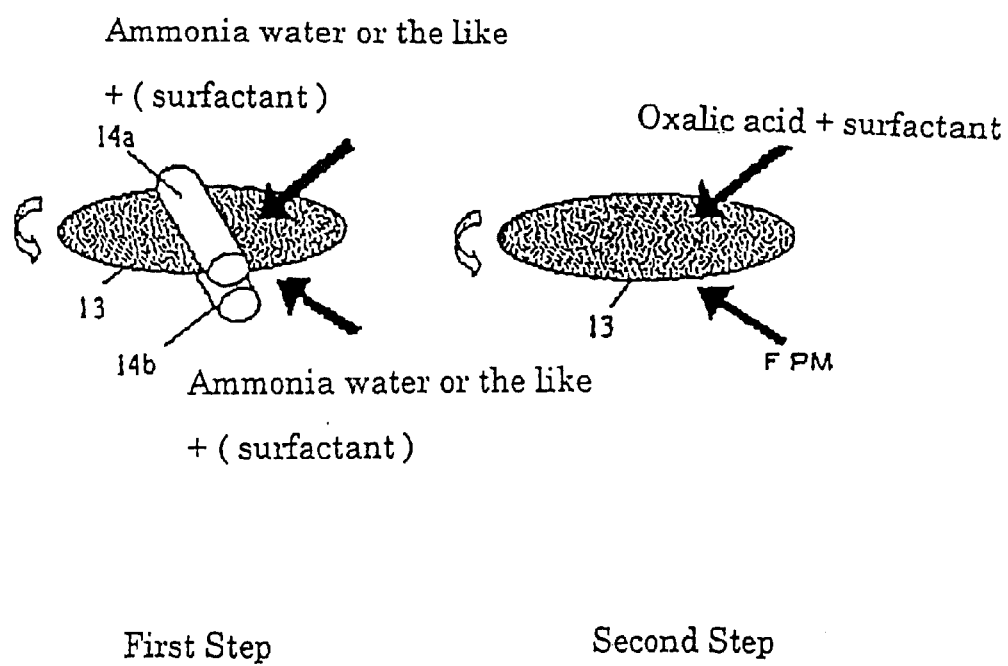
FIG. 2 is schematic drawings explaining the substrate-cleaning method of the present invention.

The cleaning is conducted in two steps as shown in FIG. 2.

In the first step is used a first cleaning solution which is a mixture of ammonia water (0.001% by weight, for example) and an anionic or cationic surfactant (100 ppm, for example), and brush cleaning is applied to the both sides of the wafer for 20 to 60 seconds. Since the first cleaning solution contains a surfactant as mentioned above, the wafer surface and the surfaces of the alumina particles remaining on the wafer are charged in the same polarity. As a result, they repel each other electrically, whereby the readhesion of alumina particles onto substrate is suppressed. Incidentally, the amount of the surfactant used in the first cleaning solution is preferably 1 to 1000 ppm.

The brush used in the first step can be a roll-shaped brush as shown in FIG. 2 or a disc-shaped brush. Ammonia water can be fed by dropping on the brush or by dropping on the wafer in the vicinity of the brush. Or, it may be fed inside the brush. In the cleaning solution, an aqueous catholyte generated in electrolysis may be used in place of the ammonia water. The aqueous catholyte is, for example, a pure water catholyte having a pH of 7.0 and a redox potential of −650 mV (reference electrode: AgCl), obtained by electrolysis of pure water, or an ammonia-containing aqueous catholyte having a pH of 8.2 and a redox potential of −770 mV, obtained by electrolysis of water containing a small amount of ammonia. Also, an aqueous solution containing dissolved hydrogen, obtained by bubbling hydrogen through pure water or dilute ammonia water may be used in place of the ammonia water.

After the completion of the first step, rinsing with pure water is conducted for 5 to 20 seconds in order to remove the first cleaning solution adhering on the both sides of the wafer.

In the second step, the wafer is subjected to spin cleaning in order to remove the metal contaminants on the wafer, using a second cleaning solution containing oxalic acid (0.5%, for example) and an anionic or cationic surfactant (100 ppm, for example). The time of spin cleaning is about 15 to 30 seconds. Then, rinsing with pure water is conducted for 10 to 30 seconds. Incidentally, the back side of the wafer may be cleaned with FPM (for example, $HF:H_2O_2:H_2O=$ 1:1:100) to remove the Cu particles or unnecessary Cu film remaining thereon.

Thereafter, the wafer is spin-dried to complete the whole cleaning operation.

In the present embodiment, by using about the same total time of chemical cleaning and rinsing in the first step and the second step, the idle time in cleaning operation can be minimized and higher cleaning efficiency can be obtained.

In the present embodiment, the cleaning chamber of the first step (alkaline atmosphere) and the cleaning chamber of the second step (acidic atmosphere) are preferred to be separated completely for prevention of salt generation.

The cleaning after Cu-CMP has been explained above. The flow sequence used in this cleaning can basically be applied to the cleaning after W-CMP.

The present invention is hereinafter described specifically by way of Examples. However, the present invention is not restricted to these Examples alone. In the following Examples and Comparative Examples, "% by weight" is relative to the total weight of cleaning solution.

EXAMPLE 1

(Production of Substrate)

Figure 5:
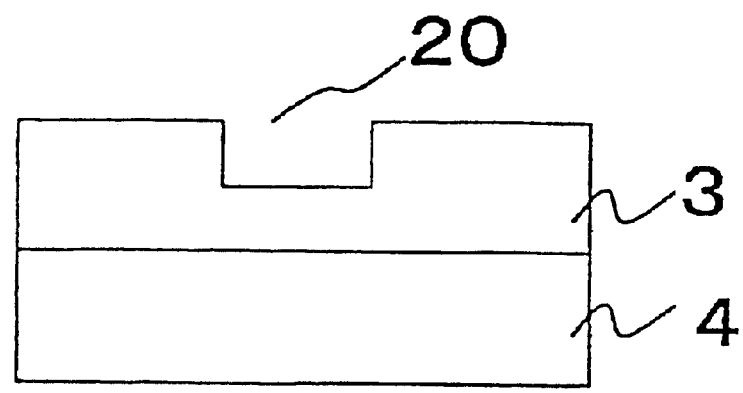
FIG. 5 is drawings explaining a production process of a substrate to be cleaned by the substrate-cleaning method of the present invention.
Figure 5:
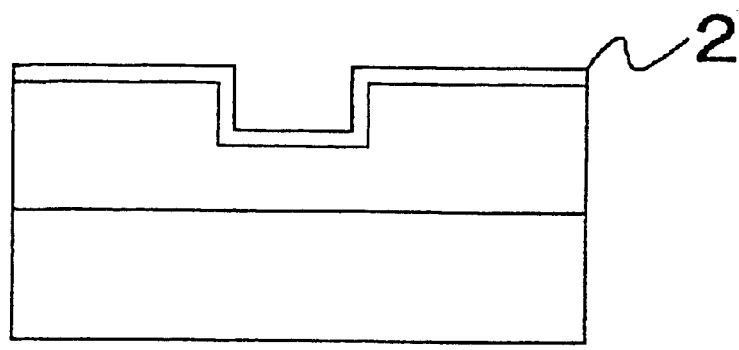
Figure 5:
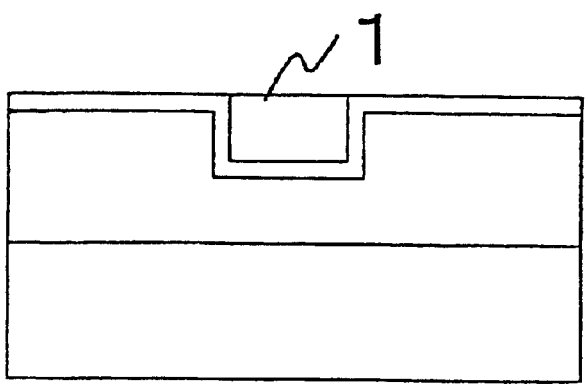

A substrate to be cleaned in the present invention was produced as shown in FIG. 5. First, an inter-layer insulating film 3 made of $SiO_2$ was formed on a silicon substrate 4 by plasma CVD. The thickness of the inter-layer insulating film 3 was 500 nm. Then, a groove 20 for interconnection was formed in a given portion of the inter-layer insulating film 3, by etching [FIG. 5(a)].

Successively, a barrier film 2 made of TiN was formed at a thickness of 80 nm at 150° C. by sputtering [FIG. 5(b)].

On the whole barrier film 2 was formed a Cu conductive film at a thickness of 500 nm at 450° C. by CVD. Then, CMP was conducted for film leveling to form a Cu interconnection 1 [FIG. 5(c)].

(Cleaning of Substrate)

The wafer after CMP, obtained above was placed in water to prevent the wafer's drying in loader of cleaning apparatus, and cleaned quickly in the cleaning apparatus connected to the CMP apparatus.

The cleaning was conducted in two steps as shown in FIG. 2.

In the first cleaning, there was used a first cleaning solution containing ammonia water (0.001% by weight) and ammonium dodecylsulfonate (200 ppm), and brush cleaning was applied to the both sides of the wafer after CMP for 20 to 60 seconds. The brush was a roll-shaped brush as shown in FIG. 2. Alumina particles are removed by this cleaning.

Then, rinsing with pure water was conducted for 5 to 20 seconds to remove the ammonia remaining on the both sides of the wafer.

In the second cleaning, there was used a second cleaning solution containing oxalic acid (0.5% by weight) and ammonium dodecylsulfonate (200 ppm), and spin cleaning was conducted for about 15 to 30 seconds. The metal contaminants on the wafer are removed by this cleaning. Then, rinsing with pure water was conducted for 10 to 30 seconds. Thereafter, the wafer was spin-dried to complete the whole cleaning operation.

In the present Example, the first cleaning chamber (alkaline atmosphere) and the second cleaning chamber (acidic atmosphere) were completely separated for prevention of salt generation.

Comparative Example 1

A substrate to be cleaned was produced in the same manner as in Example 1. The substrate was cleaned in the same manner as in Example 1 except that both the first cleaning solution and the second cleaning solution contained no surfactant. That is, in this Comparative Example, the first cleaning solution was ammonia water (0.001% by weight) and the second cleaning solution was an aqueous solution containing 0.5% by weight of oxalic acid.

The surface conditions of the wafers after cleaning in Example 1 and Comparative Example 1 are shown in Table 1. The number of particles was measured for particles having a size of 0.2 µm or more, using a laser reflection type particle analyzer. The concentration of metal impurities was measured using a TRXRF (total reflection X-ray fluorescence) analyzer. In commercial substrates, the number of particles is required to be 20 or less per 8-inch wafer

TABLE 1

| | Number of particles (per 8-inch wafer) | Metal impurities (atoms/cm$^2$) | | |
| --- | --- | --- | --- | --- |
| | | K | Fe | Cu |
| Before washing | >30000 | $2 \times 10^{12}$ | $5 \times 10^{13}$ | $7 \times 10^{12}$ |
| Example 1 | 15 | $1 \times 10^{10}$ | $<1 \times 10^{10}$ | $1 \times 10^{10}$ |
| Comparative Example 1 | 150 | $1 \times 10^{11}$ | $6 \times 10^{10}$ | $8 \times 10^{10}$ |

As is clear from the results of Table 1, particles and metal impurities can be removed effectively by the cleaning method of Example 1.

EXAMPLE 2

(Production of Substrate)

Figure 6:
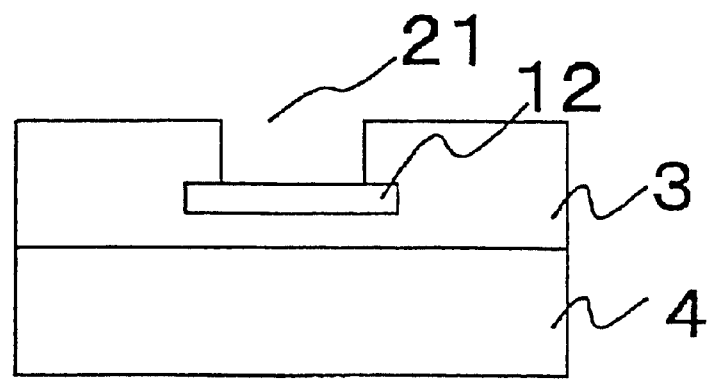
FIG. 6 is drawings explaining a production process of a substrate to be cleaned by the substrate-cleaning method of the present invention.
Figure 6:
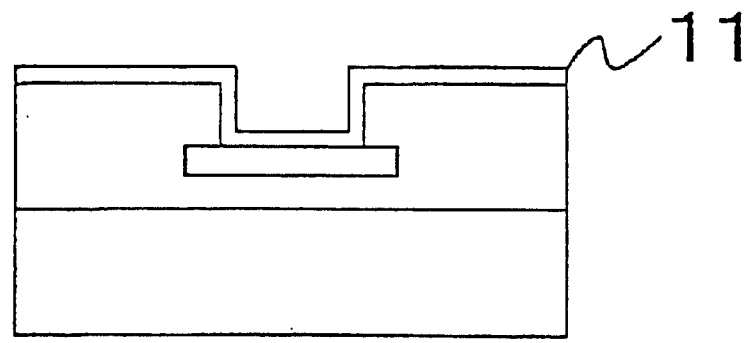
Figure 6:
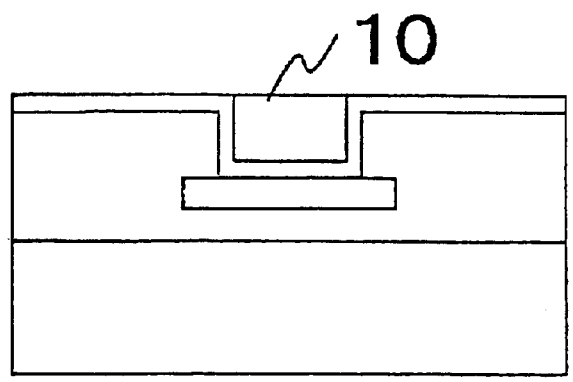

A substrate to be cleaned in the present Example was produced as shown in FIG. 6. First, an inter-layer insulating film 3 made of $SiO_2$ and a interconnection film 12 was formed on a silicon wafer 4, after which a via hole 21 was formed in a given portion of the inter-layer insulating film 3 [FIG. 6(a)].

Successively, a barrier film 11 made of TiN was formed at a thickness of 80 nm at 150° C. by sputtering [FIG. 6(b)].

On the whole barrier film 11 was formed a W conductive film at a thickness of 500 nm at 450° C. by CVD. Then, CMP was conducted for film leveling to form a W plug 10 [FIG. 6(c)].

(Cleaning of Substrate)

The wafer after CMP, obtained above was placed in water to prevent the wafer's drying in loader of cleaning apparatus, and cleaned quickly in the cleaning apparatus connected to the CMP apparatus.

The cleaning was conducted in two steps as shown in FIG. 2.

In the first cleaning, there was used a first cleaning solution containing ammonia water (0.001% by weight) and ammonium dodecylsulfonate (400 ppm), and brush cleaning was applied to the both sides of the wafer after CMP for 20 to 60 seconds. The brush was a roll-shaped brush as shown in FIG. 2. Alumina particles are removed by this cleaning.

Then, rinsing with pure water was conducted for 5 to 20 seconds to remove the ammonia remaining on the both sides of the wafer.

In the second cleaning, there was used a second cleaning solution containing oxalic acid (0.5% by weight) and ammonium dodecylsulfonate (400 ppm), and spin cleaning was conducted for about 15 to 30 seconds. The back side of the wafer was treated with FPM (Hf:$H_2O_2$:H2O=1:1:100) to remove Cu articles and unnecessary Cu film. The metal contaminants on the wafer are moved by this cleaning. Then, rinsing with pure water was conducted for 10 to 30 seconds. Thereafter, the wafer was spin-dried to complete the whole cleaning operation.

In the present Example, the first cleaning chamber (alkaline atmosphere) and the second cleaning chamber (acidic atmosphere) were completely separated for prevention of salt generation.

Comparative Example 2

A substrate to be cleaned was produced in the same manner as in Example 2. The substrate was cleaned in the same manner as in Example 2 except that both the first cleaning solution and the second cleaning solution contained no surfactant. That is, in this Comparative Example, the first cleaning solution was ammonia water (0.001% by weight) and the second cleaning solution was an aqueous solution containing 0.5% by weight of oxalic acid.

Figure 7:
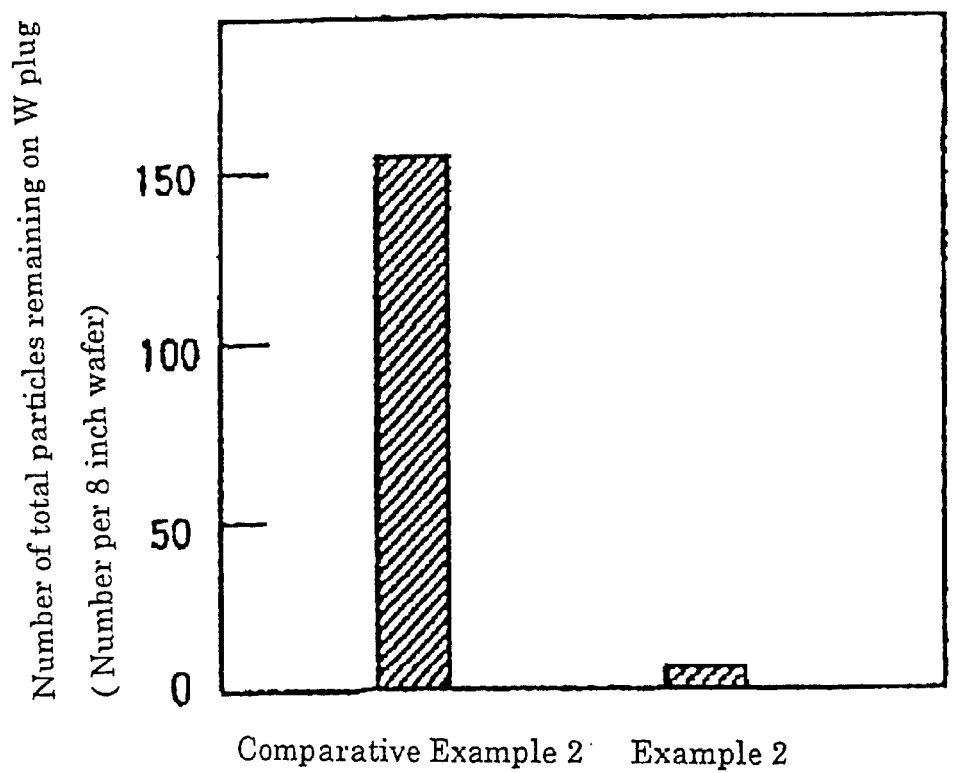
FIG. 7 is a graph showing the number of the total particles remaining on the water after the first step of the substrate-cleaning method of the present invention.
Figure 8:
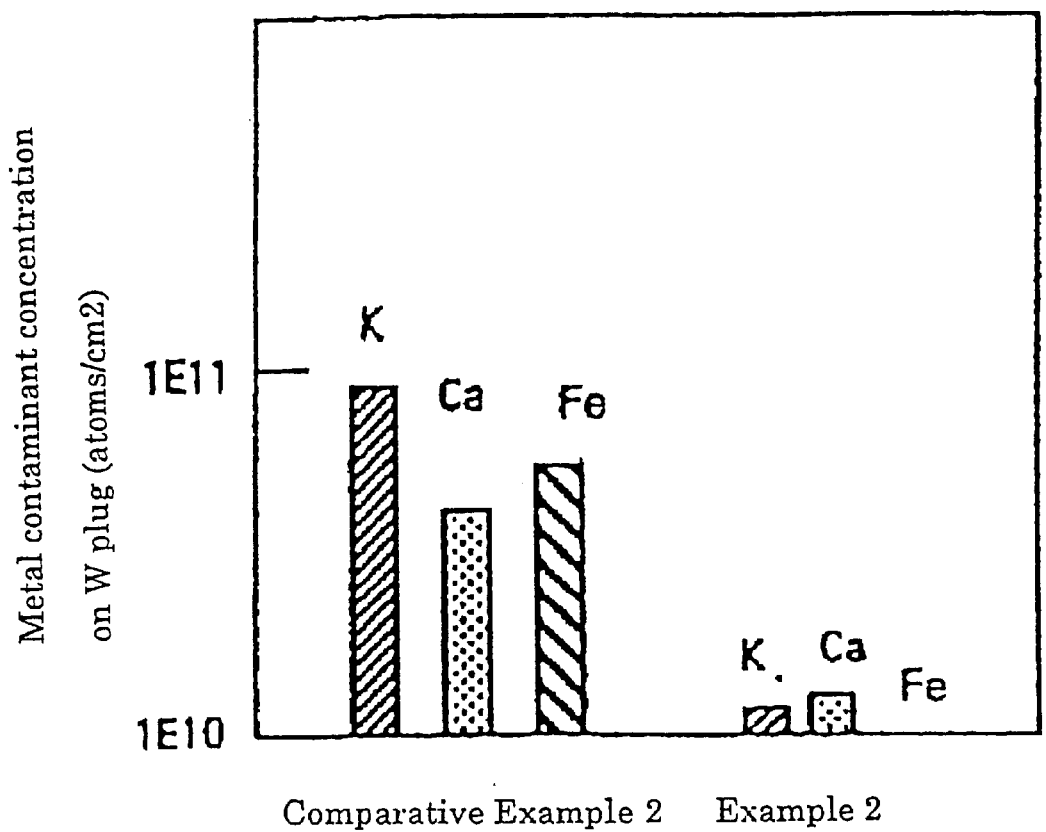
FIG. 8 is a graph showing the concentration of the metal contaminants (metal impurities) remaining on the water after the second step of the substrate-cleaning method of the present invention.
Figure 9:
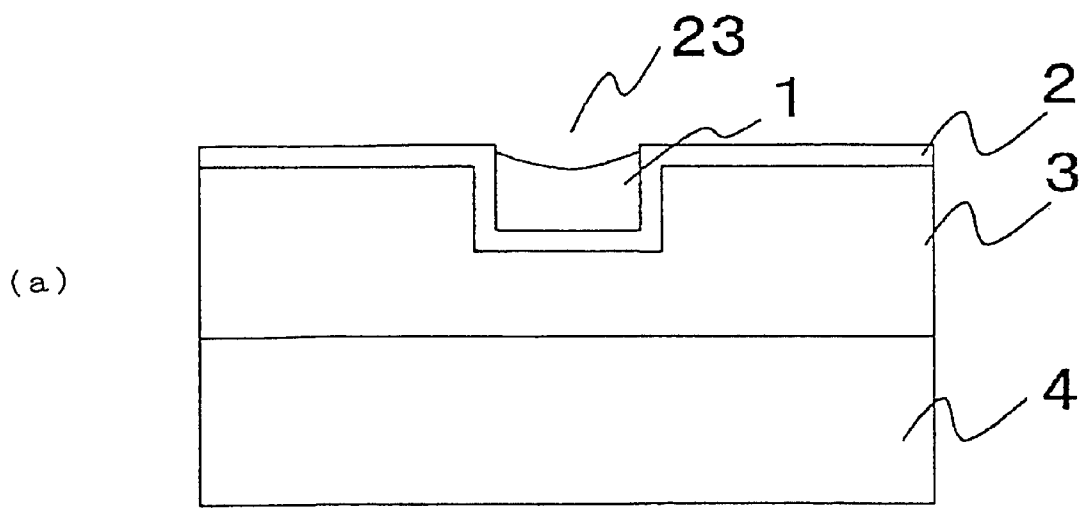
FIG. 9 is sectional views of a substrate explaining a state that dishing has appeared after CMP.
Figure 9:
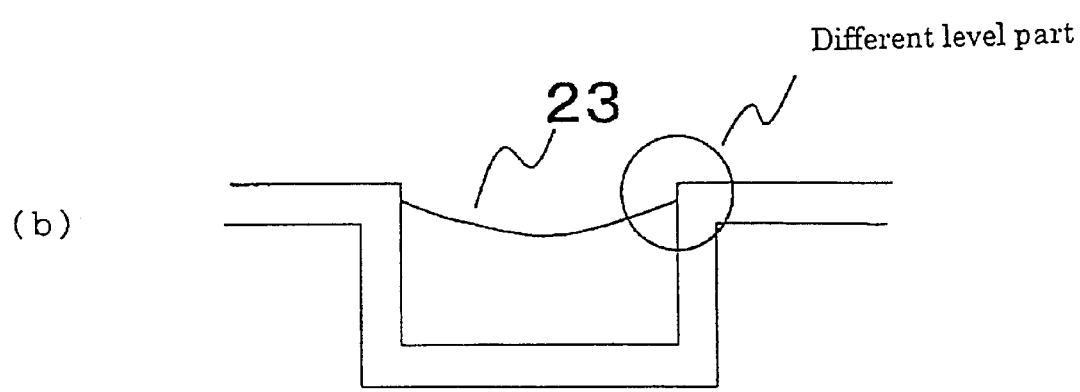

The cleaning effects in Example 2 and Comparative Example 2 were compared for each cleaning step. The results are shown in FIG. 7 and FIG. 8. FIG. 7 is a drawing showing the surface contamination of the wafer after the first cleaning step. FIG. 8 is a drawing showing the surface contamination of the wafer after the second cleaning step. In both of the first cleaning step and the second cleaning step, Example 2 showed superior cleaning effect.

As described above, in the substrate-cleaning method of the present invention, cleaning is conducted first using ammonia water or the like and then using a cleaning solution containing (a) a first complexing agent capable of easily forming a complex with the oxide of the metal material on substrate or the oxide of the metal contained in polishing solution and (b) an anionic or cationic surfactant. Thereby, the particles and metal contaminants remaining on a substrate which has a metal material and a semiconductor material both exposed at the surface and which has been subjected to CMP, particularly the metal impurities adhering onto the metal region of the substrate, can be removed effectively; and high level of cleaning which has been unobtainable by conventional techniques, can be achieved.

Further, the substrate-cleaning solution of the present invention contains (a) a first complexing agent capable of easily forming a complex with the oxide of the metal material on substrate and (b) an anionic or cationic surfactant; therefore, exhibits excellent cleaning effect particularly when applied to the cleaning of a substrate having a metal material and a semiconductor material both exposed at the surface.

This application is based on application NO.HEI10-252661 filed in Japan, the content of which is incorporated hereinto by reference.

What is claimed is:

1. A substrate-cleaning method used for cleaning of a substrate which has a metal material and a semiconductor material both exposed at the surface and which has been subjected to a chemical mechanical polishing treatment with a polishing solution, said method comprising the steps of:

(A) a first step of cleaning said substrate with a first cleaning solution containing ammonia water or an aqueous catholyte generated in electrolysis, and (B) a second step of cleaning the substrate after the first step (A) with a second cleaning solution (a) a first complexing agent capable of easily forming a complex with the oxide of said metal material or the oxide of the metal contained in said polishing solution, and (b) an anionic or cationic first surfactant, wherein the first surfactant is $C_8H_{17}N(CH_3)_3Br$ or $C_{12}H_{25}N\,(C_2H_5)(CH_3)_2Br$.

2. A substrate-cleaning method according to claim 1, wherein the first complexing agent is selected from the group consisting of a carboxylic acid and a salt of a carboxylic acid.

3. A substrate-cleaning method according to claim 2, wherein the carboxylic acid or the salt thereof is oxalic acid, citric acid, malic acid, maleic acid, succinic acid, tartaric acid, malonic acid, or a salt thereof.

4. A substrate-cleaning method according to claim 1, wherein the second cleaning solution further contains (c) a second complexing agent capable of easily forming a complex with the metal impurities remaining on the surface of the substrate subjected to the chemical mechanical polishing treatment.

5. A substrate-cleaning method according to claim 4, wherein the second complexing agent is selected from the group consisting of a polyaminocarboxylic acid and an ammonium salt of a polyaminocarboxylic acid.

6. A substrate-polishing method according to claim 4, wherein the second complexing agent is selected from the group consisting of an ethylenediaminetetraacetic acid (EDTA), a trans-1,2-cyclohexanediaminetetraacetic acid (CyDTA), a nitrilotriacetic acid (NTA), a diethylenetriaminepentaacetic acid (DTPA), a N-(2-hydroxyethyl) ethylenediamine-N,N',N'-triacetic acid (EDTA-OH), and a salt thereof.

7. A substrate-cleaning method according to claim 1, wherein the first cleaning solution further contains an anionic or cationic second surfactant.

8. A substrate-cleaning method according to claim 7, wherein the second surfactant is selected from the group consisting of an ammonium salt of sulfuric ester and a primary, secondary or tertiary amine salt of sulfuric ester.

9. A substrate-cleaning method according to claim 7, wherein the second surfactant is selected from the group consisting of $C_{12}H_{25}O(CH_2CH_2O)_2SO_3H$, $C_9H_{19}PhO(CH_2CH_2O)_4SO_3H$, $C_{12}H_{25}O(CH_2CH_2O)_4SO_3H$, and an ammonium salt or primary, secondary or tertiary amine salt thereof.

10. A substrate-cleaning method according to claim 1, wherein the metal material is selected from the group consisting of tungsten, copper and aluminum.

11. A substrate-cleaning method according to claim 1, wherein the substrate has an inter-layer insulating film made of said semiconductor material and there is formed, in the inter-layer insulating film, a groove or hole filled with said metal material.

12. A substrate-cleaning method according to claim 11, wherein a barrier film is formed on the inner surface of the groove or hole and a film made of said metal material is formed on the barrier film.

13. A substrate-cleaning method used for cleaning of a substrate which has a metal material and a semiconductor material both exposed at the surface and which has been subjected to a chemical mechanical polishing treatment with a polishing solution, said method comprising the steps of:

(A) a first step of cleaning said substrate with a first cleaning solution containing ammonia water or an aqueous catholyte generated in electrolysis, and (B) a second step of cleaning the substrate after the first step (A) with a second cleaning solution (a) a first complexing agent capable of easily forming a complex with the oxide of said metal material or the oxide of the metal contained in said polishing solution, and (b) an anionic or cationic first surfactant, wherein the first cleaning solution further contains an anionic or cationic second surfactant, wherein the second surfactant is $C_8H_{17}N(CH_3)_3Br$ or $C_{12}H_{25}N\,(C_2H_5)(CH_3)_2Br$.

14. A substrate-cleaning method according to claim 13, wherein the first surfactant is selected from the group consisting of an ammonium salt of sulfuric ester and a primary, secondary or tertiary amine salt of sulfuric ester.

15. A substrate-cleaning method according to claim 13, wherein the first surfactant is selected from the group consisting of $C_{12}H_{25}O(CH_2CH_2O)_2SO_3H$, $C_9H_{19}PhO(CH_2CH_2O)_4SO_3H$, $C_{12}H_{25}O(CH_2CH_2O)_4SO_3H$, and an ammonium salt or primary, secondary or tertiary amine salt thereof.

* * * * *